United States Patent
Duncan et al.

(10) Patent No.: US 6,894,557 B2
(45) Date of Patent: *May 17, 2005

(54) METHOD FOR TUNING A CORNER FREQUENCY OF A LOW PASS FILTER

(75) Inventors: Ralph A. Duncan, Laguna Beach, CA (US); Chun-Ying Chen, Irvine, CA (US); Young J. Shin, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/767,424

(22) Filed: Jan. 30, 2004

(65) Prior Publication Data

US 2004/0183589 A1 Sep. 23, 2004

Related U.S. Application Data

(63) Continuation of application No. 09/995,795, filed on Nov. 29, 2001, now Pat. No. 6,710,644.
(60) Provisional application No. 60/250,616, filed on Nov. 29, 2000.

(51) Int. Cl.[7] ................................................ H03K 5/00
(52) U.S. Cl. ....................................... 327/558; 327/555
(58) Field of Search ................................ 327/552, 553, 327/554, 555, 558

(56) References Cited

U.S. PATENT DOCUMENTS

| | | | |
|---|---|---|---|
| 3,872,329 A | 3/1975 | Dodson, III | |
| 4,331,944 A | 5/1982 | Lee | |
| 4,354,250 A | 10/1982 | Lee | |
| 4,849,661 A | 7/1989 | Bazes | |
| 5,210,504 A | 5/1993 | Yagita et al. | |
| 5,604,501 A | * 2/1997 | McPartland | .................. 341/144 |
| 5,819,157 A | 10/1998 | Ben-Efraim et al. | |
| 5,859,559 A | 1/1999 | Hong et al. | |
| 5,884,154 A | 3/1999 | Sano et al. | |
| 5,930,696 A | 7/1999 | Tzuang et al. | |

(Continued)

FOREIGN PATENT DOCUMENTS

| | | |
|---|---|---|
| DE | 199 24 039 A1 | 12/1999 |
| GB | 2 339 351 A | 1/2000 |
| WO | WO 00/13306 A1 | 3/2000 |

OTHER PUBLICATIONS

Copy of International Search Report from Appln. No. PCT/US01/44321, mailed Oct. 30, 2002, 7 pages.
Copy of Written Opinion from Appl. No. PCT/US01/44321, mailed Jul. 23, 2003, 6 pages.
Sedra et al., *Microelectronic Circuits*, CBS College Publishing, New York, NY, 1987, pp. 96–100 and 805.

*Primary Examiner*—Terry D. Cunningham
(74) *Attorney, Agent, or Firm*—Sterne, Kessler, Goldstein & Fox P.L.L.C.

(57) ABSTRACT

An integrated circuit formed on a semiconductor chip, comprising a low pass filter circuit having a first resistor of a first resistance value and a capacitor of a first capacitance value, wherein the first resistance value and the first capacitance value determine a corner frequency of the filter; and a tuning circuit having a second resistor of a second resistance value, a switched-capacitor of a third resistance value and a comparator that compares two voltage signals to produce a control signal, wherein the control signal adjusts the first and second resistance values as a function of the third resistance value. The corner frequency of the filter can be adjusted by varying one or more reference voltage signals. In combination, the corner frequency of the filter is adjusted by changing the frequency of a clock that controls the switched-capacitor to decrease the circuit sensitivity.

13 Claims, 4 Drawing Sheets

U.S. PATENT DOCUMENTS

| | | |
|---|---|---|
| 5,942,935 A | 8/1999 | Okanobu |
| 5,950,112 A | 9/1999 | Hori et al. |
| 6,031,878 A | 2/2000 | Tomasz et al. |
| 6,069,510 A | 5/2000 | Keeth |
| 6,150,875 A | 11/2000 | Tsinker |
| 6,166,591 A * | 12/2000 | Schultz et al. ............... 327/544 |
| 6,218,885 B1 | 4/2001 | Ellis |
| 2002/0120937 A1 | 8/2002 | Chang |
| 2002/0190783 A1 | 12/2002 | Duncan et al. |
| 2003/0045263 A1 | 3/2003 | Wakayama et al. |

* cited by examiner

METHOD FOR TUNING A CORNER FREQUENCY OF A LOW PASS FILTER

CROSS-REFERENCE TO RELATED APPLICATIONS

This application is a continuation of U.S. Ser. No. 09/995,795 (published as U.S. Pub. App. No. 2002/0190783 A1), filed Nov. 29, 2001 now U.S. Pat No. 6,710,644, entitled "Low Pass Filter Corner Frequency Tuning Circuit And Method," which claims the benefit of U.S. Provisional Application No. 60/250,616 ("the '616 Provisional"), filed Nov. 29, 2000, titled "Fully Integrated Direct Conversion Satellite Receiver," which are both incorporated herein by reference in their entireties.

This application is also related to the following U.S. Non-Provisional applications, which are all incorporated by reference herein in their entireties.

U.S. Ser. No. 10/647,588, filed Aug. 26, 2003, which is a divisional of U.S. Ser. No. 09/995,695 (published as U.S. Pub. App. No. 2003/0045263 A1), filed Nov. 29, 2001, entitled "Integrated Direct Conversion Satellite Tuner," which claimed benefit to the '616 provisional.

U.S. Ser. No. 09/995,690 (published as U.S. Pub. App. No. 2002/0120937 A1), filed Nov. 29, 2001, entitled "Apparatus for Reducing Flicker Noise in a Mixer Circuit," which claimed benefit to the '616 provisional.

BACKGROUND OF THE INVENTION

1. Field of the Invention

The present invention is related to semiconductor integrated circuits, and specifically, to an active low pass filter having a tuning circuit to minimize the impact of temperature and process variations.

2. Background Art

Today mixed-signal integrated circuits comprise both analog and digital components on a single chip. Such mixed-signal integrated circuits include devices such as transistors, capacitors, resistors, inductors, and the like. These devices are coupled together in a plethora of ways to form simple components, such as logic gates, registers and memory cells, as well as more complicated components, including entire microprocessors, memory arrays, amplifiers, and the like.

The frequency response of active filters is determined by the values of their various resistance-capacitance (RC) elements. Although switches, small-value capacitors, and operational amplifiers can be realized in integrated circuits using MOS technology, it is very difficult to make resistors and capacitors with the values and accuracy required by certain radio frequency (RF) applications.

This integration drawback has been overcome by implementing resistors with MOS capacitors coupled between MOS switches that are rapidly switched on and off. Such devices are called "switched capacitors." Switched-capacitors can commonly be used in electronic applications to realize a wide variety of active filters that have the advantages of compactness and tunability. They are typically used to replace resistors in active filter circuits. The time constants arising from these simulated resistances and other MOS capacitors are based on capacitance ratios. Providing values set by capacitor ratios to control the time constants yields on-chip RC components that are less susceptible to errors due to manufacturing process variations, and temperature changes. However, the usefulness of switched-capacitors with operational amplifiers circuits is limited. The DC offset voltages plagued by non-ideal operational amplifiers causes loss of accuracy at low operating voltage levels.

What is needed is a switched-capacitor circuit technique for eliminating the adverse impact of operational amplifier DC offset voltages.

BRIEF SUMMARY OF THE INVENTION

The present invention is directed to an integrated circuit formed on a semiconductor chip comprising a low pass filter circuit and a tuning circuit. The low pass filter circuit has a first resistor of a first resistance value and a capacitor of a first capacitance value, wherein the first resistance value and the first capacitance value determine a corner frequency of the filter.

The tuning circuit has a second resistor of a second resistance value, a switched-capacitor of a third resistance value and a comparator that compares two voltage signals and produces a control signal, wherein the control signal adjusts the first and second resistance values as a function of the third resistance value.

In one embodiment of the integrated circuit, a first one of the two voltage signals is coupled to the switched-capacitor and a second one of the two voltage signals is coupled to the comparator, wherein the integrated circuit further comprises means for adjusting the corner frequency of the filter by varying at least one of the two voltage signals.

In another embodiment of the integrated circuit, the integrated circuit includes a clock to control the switched-capacitor, wherein the corner frequency of the filter can be adjusted by varying frequency of the clock.

In yet another embodiment, the corner frequency of the filter can be changed by adjusting the corner frequency and by adjusting at least one of the two voltage signals.

These and other advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

DETAILED DESCRIPTION OF THE INVENTION

The preferred embodiment of the present invention will now be discussed in detail. While specific features, configurations and arrangements are discussed, it should be understood that this is done for illustration purposes only. A person skilled in the relevant art will recognize that other steps, configurations and arrangements may be used without departing from the spirit and scope of the invention. Indeed, for the sake of brevity, conventional electronics and other functional aspects of the method/apparatus (and components of the individual operating components of the apparatus) may not be described in detail herein. Furthermore, for purposes of brevity, the invention is frequently described herein as pertaining to satellite tuners. It should be appreciated, however, that many other devices having one or more low pass filters could be readily modified to included the present invention, and thus the techniques described herein could be used in connection with other such devices. Moreover, it should be understood that general references (e.g., "first", "second", etc.) made herein are for purposes of illustration only.

Figure 1:
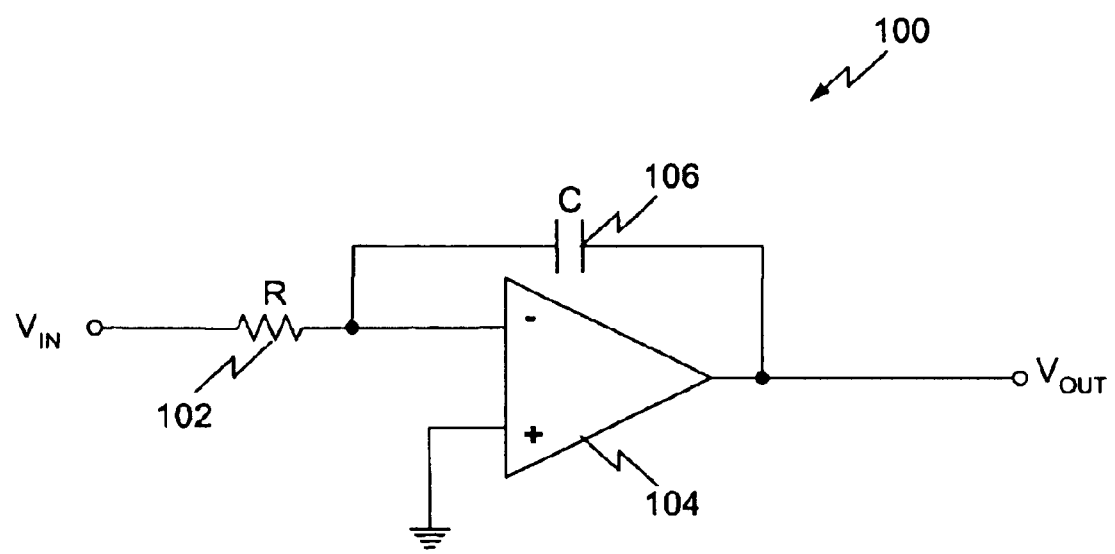
FIG. 1 illustrates a conventional low pass filter circuit.

FIG. 1 illustrates a conventional first order RC low-pass filter 100 (e.g., an inverting integrator). The filter 100 receives an input signal ($V_{IN}$) at a resistor 102, which in turn is coupled to an inverting input of an operational amplifier 104. A non-inverting input of the operational amplifier 104 is coupled to ground. A capacitor 106 is coupled between the inverting input of operational amplifier 104 and its output node. The circuit produces an output signal ($V_{OUT}$). The first order RC low-pass filter corner frequency is set by $1/(2\pi RC)$.

Figure 2:
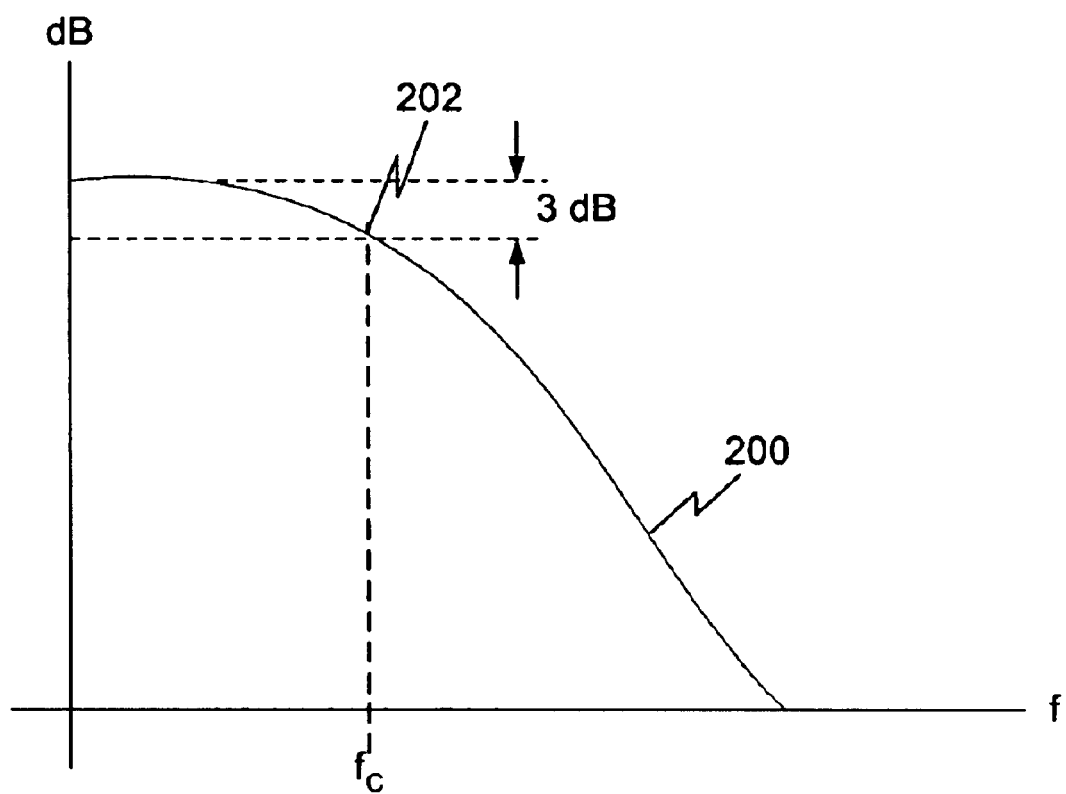
FIG. 2 is a plot illustrating the frequency response of the low pass filter of FIG. 1.

FIG. 2 illustrates the frequency response of a conventional low-pass filter, which plots magnitude (in decibel "dB" units) versus frequency (f). Any person skilled in the relevant art will be familiar with circuit 100 and its transfer characteristics, as well as many practical implications and uses of such a filter. For example, it is well known that the −3 dB point 202 on curve 200 of FIG. 2 represents the "corner frequency" or "cutoff frequency" of the low-pass filter (e.g., circuit 100). A cutoff frequency ($f_C$), corresponding to the cutoff point 202, is equal to the reciprocal of the product of the $2\pi RC$ (i.e., $f_C=1/(2\pi RC)$).

In the satellite receiver, for example, a low-pass filter (LPF) can be used to select the desired channel. The corner frequency of low-pass filter needs to be programmable from 2 MHz to 36 MHz. The LPF corner frequency must be accurately tuned within 1 MHz. However, as noted in the background section, due to manufacturing process and temperature variations between different integrated circuits, manufacturing accurate LPFs comprising integrated resistors and capacitors can be difficult. Moreover, although capacitors having similar structures on a single integrated circuit will yield substantially the same capacitance value, that value cannot be controlled tightly enough. Armed with this knowledge, the present inventors endeavored to develop a circuit to achieve accurate LPF corner frequencies.

Figure 3:
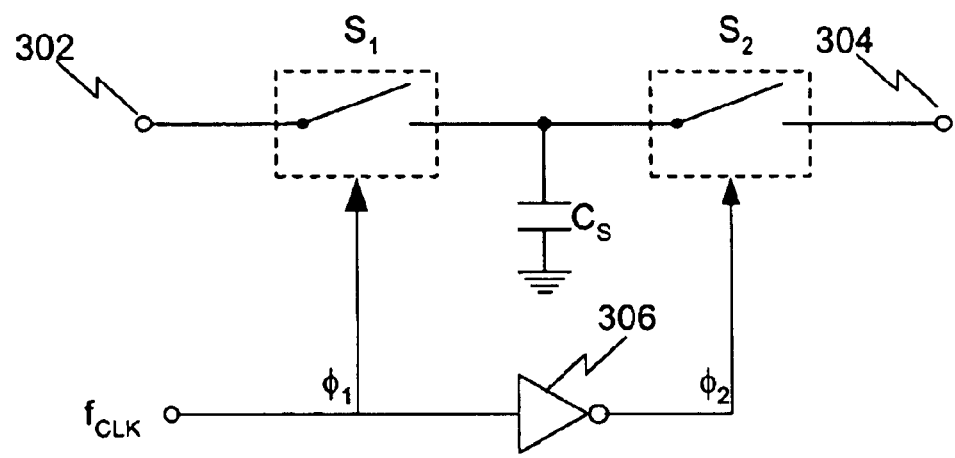
FIG. 3 illustrates a conventional switched-capacitor circuit.

One known technique for tuning LPFs is to implement resistor 102 in FIG. 1 with a switched-capacitor. A conventional switched-capacitor is illustrated in FIG. 3. The switched-capacitor filter technique is based on the realization that a capacitor switched between two circuit nodes at a sufficiently high rate is equivalent to a resistor connecting these two nodes. Specifically, the two switches $S_1$ and $S_2$ of FIG. 3 are driven by a non-overlapping, two-phase clock, $f_{CLK}$. It is assumed, for this explanation, that the clock frequency $f_{CLK}$ is much higher than the frequency of the signal being filtered by the circuit 100, assuming that the switched-capacitor were used in place of the resistor 102. During clock phase $\phi_1$ capacitor $C_S$ charges up to a voltage at node 302 by closing $S_1$. Then, during a second clock phase $\phi_2$, capacitor $C_S$ is connected to the output node 304 by closing $S_2$. In a case where output node 304 is the non-inverting input of operational amplifier 104 in FIG. 1, the capacitor $C_S$ is forced to discharge, and its previous charge is transferred. Thus, if $f_{CLK}$ is much higher than the frequency of the voltage wave forms of $V_{IN}$, then the switching process can be taken to be essentially continuous, and a switched-capacitor can then be modeled as an equivalent resistance as shown below in equation 1:

$$R_{eq} = \frac{1}{C_S \cdot f_{CLK}} \quad (1)$$

Therefore, the use of a switched-capacitor in conjunction with the capacitor 106 in FIG. 1, and the operational amplifier 104 can be used to achieve an active low-pass filter. As can be seen from Equation 1, use of the switched-capacitor enables the active filter to be "tuned" by varying the frequency of $f_{CLK}$, which thereby changes the value of R and the cutoff frequency.

For illustration purposes, FIG. 3 includes an inverter 306 that inverts $f_{CLK}$ to generate the opposite phase clock $100_2$. Any person skilled in the relevant art will recognize that the non-overlapping clocks $\phi_1$ and $\phi_2$ can be produced in many ways. Moreover, switches $S_1$ and $S_2$ can be implemented with transistors (for example, metal oxide semiconductor field affect transistors (MOSFETs), or the like). Additionally, various means are commercially available for generating the clock frequency. Voltage controlled oscillators (VCOs), for example, include a control input to adjust the oscillation frequency. Background on active low-pass filters and switched-capacitors is found in "Microelectronic Circuits," A. S. Sedra et al.(Holt, Reinhart and Winston publishers, 1987), and "Applications of the Switched-Capacitor Circuits in Active Filters and Instrumentation Amplifiers," W. R. Grise (*The Technology Interface* Vol. 3, No. 3, Fall 1999, ISSN No. 1523-9926).

Figure 4:
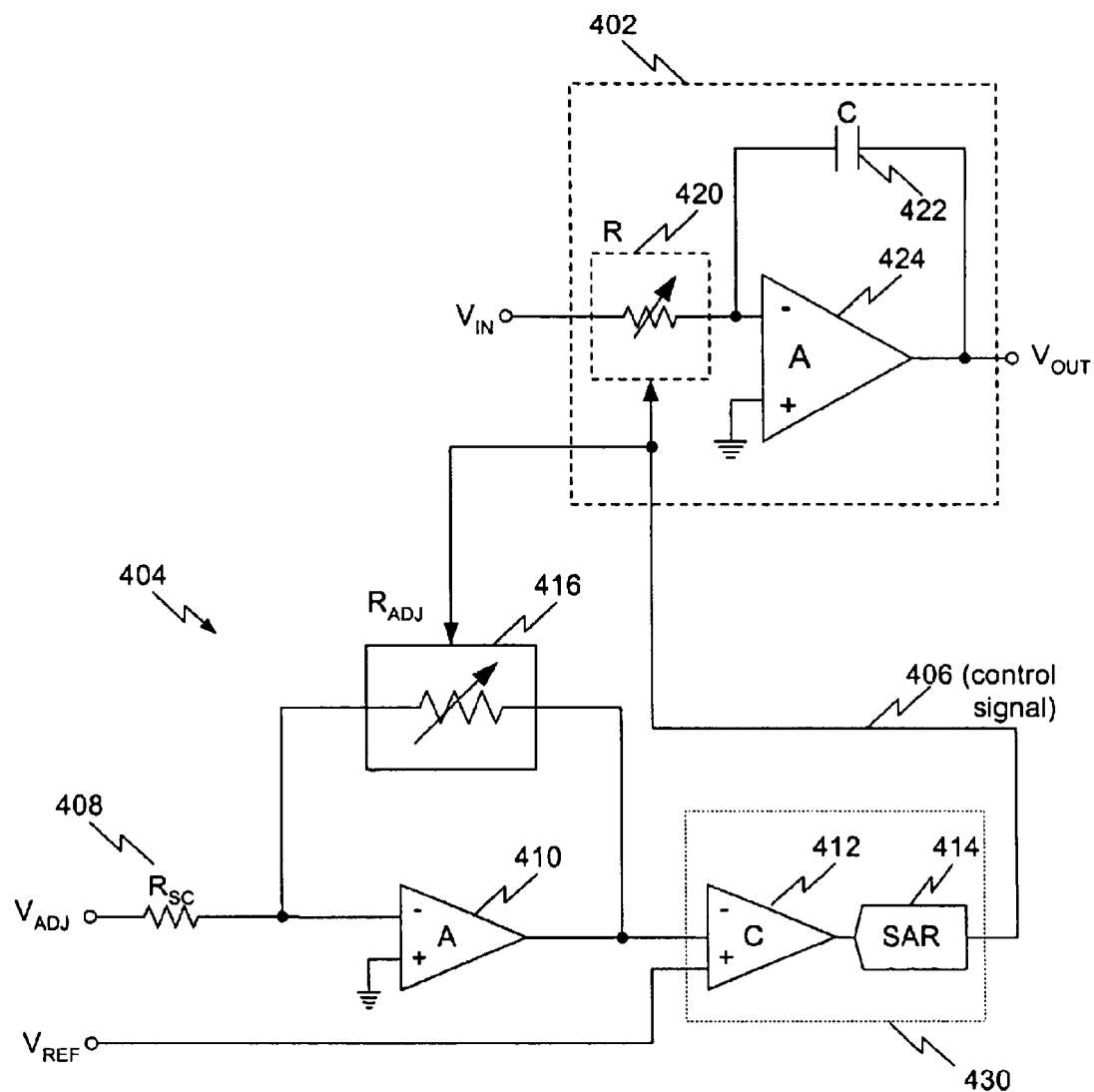
FIG. 4 illustrates an active low pass filter with a tuning circuit in connection with the present invention.

Turning now to the present invention, FIG. 4 illustrates an active low-pass filter and comparator circuit for achieving accurate filtering on an integrated circuit. In order to overcome manufacturing process variations and errors introduced by temperature variations, the inventors have combined an active low-pass filter 402 (e.g., an inverting integrator) with a tuning circuit 404 in order to accurately adjust the corner frequency of the low-pass filter 402. In general, the tuning circuit 404 generates a control signal 406 to adjust two variable resistors (416 (e.g., resistor $R_{ADJ}$)and 420 (e.g., resistor R). Variable resistor 416 in the tuning circuit 404 and variable resistor 420 in the active low-pass filter 402 are identical and are adjusted by control signal 406 as a function of the equivalent resistance of a switched-capacitor 408 and the VADJ/VREF ratio that determines the corner frequency of the low-pass filter 402.

Specifically, tuning circuit 404 comprises switched capacitor 408, an amplifier 410, a comparator 412 (e.g., an operational amplifier), a successive approximation register (SAR) architecture analog-to-digital converter 414 and a variable resistor 416. An adjustable voltage (VADJ) is applied to an input of the switched-capacitor 408. An output of switched-capacitor 408 is coupled to an inverting input of amplifier 410. A non-inverting input of amplifier 410 is coupled to ground. An output of amplifier 410 is coupled to an inverting input of a comparator 412.

A reference voltage ($V_{REF}$) is coupled to a non-inverting input of comparator 412. An output of comparator 412 is coupled to an input of A/D converter 414. The A/D converter 414 produces the control signal 406, which is described in further detail below. The variable, or otherwise adjustable resistor ($R_{ADJ}$) 416 is coupled between the inverting input of amplifier 410 and its output (which is also the inverting input of comparator 412). Control signal 406 is also coupled to $R_{ADJ}$ 416 to change its resistance value.

The active low-pass filter (LPF) 402 comprises a variable resistor 420, a capacitor 422 and an amplifier 424 (e.g., an operational amplifier). A signal to be filtered is applied to a first node label VIN, which is coupled to resistor 420. Resistor 420 also coupled to the inverting input of amplifier 424. A non-inverting input of amplifier 424 is coupled to ground. Capacitor 422 is coupled across the inverting input of amplifier 424 and its output node, which is labeled as VOUT. Variable resistor 420 also receives control signal 406 to change its resistance value.

Operation of the tuning circuit 404 in FIG. 4 will be described next. To illustrate the operation of tuning circuit 404, assume voltages VADJ and VREF are kept constant. Also, for this explanation, assume comparator 412 and A/D converter 414 simply comprise a comparator 430 that produces the control signal 406 to adjust resistor 416. In this case, the comparator 430 will produce a control signal 406 to adjust resistor 416 to match the value of resistor 408 until the output voltage of amplifier 410 is equal to VREF. Thus, once the voltage levels at the input of comparator 430 are the same, control signal 406 will no longer change the resistance of resistor 416.

In order to establish accurate corner frequencies for active low-pass filter 402, the product of the resistance value for resistor 420 and the nominal capacitance value for capacitor 422 must be accurate. Since a stable capacitance value can be achieved using existing semiconductor manufacturing techniques, an initial capacitance value for capacitor 422 can be determined. However, because of processing variations and temperature variations, the exact capacitance of the capacitor can vary from chip to chip. Because the capacitance would vary from chip to chip, even though an accurate fixed resistance value for the resistor 420 is provided, the corner frequency will also vary, as described above.

The exact corner frequency, however, can be achieved by varying the resistance of resistor 420 to an exact resistance value equal to $1/(2\pi \cdot f_C \cdot C)$, where fc is the corner frequency of the low-pass filter. This can be achieved using a switch-capacitor circuit 408.

According to the present invention, a capacitance value and switching frequency value are selected for switching-capacitor 408 in order to achieve the exact desired resistance for the active low-pass filter 402. In operation, since the ideal comparator 430 produces control signal 406 so as to cause the resistance of variable resistor 416 to match the resistance of switch capacitor 408, control signal 406 is also supplied to variable resistor 420. Thus, by achieving a desired equivalent resistance at switched capacitor 408, the tuning circuit 404, via comparator 430, will produce a control signal 406 so as to cause resistor 420 of the active low pass filter 402 to produce a resistance value for resistor 420 equal to the affective resistance of switch-capacitor 408 equal to $1/(f_{CLK} \cdot C_{SC})$, where $fc_{LK}$ is the switching frequency and $C_{SC}$ is the capacitance value of the $C_S$ in FIG. 5. Equating this resistance value to $1/(2\pi \cdot f_C \cdot C)$ in order to get the desired accurate corner frequency of the low-pass filter will be described later. In summary, the resistance of variable resistors 416 and 420 is adjusted via the control signal 406 until the desired value for the LPF corner frequency is achieved.

According to one embodiment of the present invention, adjusting $f_{CLK}$ of the switched capacitor 408 will change its resistance. To compensate, comparator 430 adjusts control signal 406 to change the value of resistor 420, thereby changing the LPF corner frequency of the active low-pass filter 402.

According to another embodiment of the present invention, control signal 406 is changed by adjusting a ratio "K" of voltages $V_{ADJ}$ and $V_{REF}$ (i.e., K=$V_{ADJ}/V_{REF}$), while $f_{CLK}$ remains constant:

$$R = \frac{1}{C_{SC} \cdot f_{CL}K} \quad (2)$$

Changing the ratio "K" causes the differential voltage at the input of comparator 430 to change. To compensate, the comparator 430 changes control signal 406 so as to vary the resistance of adjustable resistor $R_{ADJ}$ 416, thereby causing the voltage at its inverting input to again match the voltage at its non-inverting input. At the same time control signal 406 adjusts the resistance of resistor 416 to compensate for the changed voltage ratio, control signal 406 also changes the resistance of resistor 420 thereby changing the corner frequency of the active low-pass filter 402. In order to tune the corner frequency of the low-pass filter from 2 MHz to 36 MHz, K is varied from 1 to 18 respectively in this design. However, in order to make the design insensitive to errors produced by the non-idealities of the switch capacitor circuit 408 and the operational amplifier 410, high values of K are desired. By dividing $f_{CL}K$ for lower-half corner frequencies, K is circulated from 8 to 18 instead of changing from 1 to 18. This technique improves the circuit sensitivity for corner frequencies from 2 MHz to 15 MHz. The sensitivity is further improved by reducing the offset voltage of the operational amplifier 410 and the comparator 412 by employing an offset-cancellation scheme in the comparator 412.

Also, according to this latter embodiment of the present invention, the ratio of voltages $V_{ADJ}$ and $V_{REF}$ can be changed by changing either $V_{ADJ}$ or $V_{REF}$, or both $V_{ADJ}$ and $V_{REF}$. Preferably, $V_{REF}$ can be set to a constant reference voltage, while voltage $V_{ADJ}$ is adjusted so as to change the corner frequency of the active low-pass filter 402. The voltages $V_{ADJ}$ and $V_{REF}$ can be implemented using a resistor ladder with variable tap points. Other voltage sources can be used to provide $V_{ADJ}$ and $V_{REF}$, as would become apparent to a person skilled in the relevant art.

The switch capacitance CSC can be implemented as a NMOS-in-NWELL capacitor, similar to the capacitor 422 in the low-pass filter 402. For this design, fCLK is equal to 16 MHz, and the value of CSC is scaled to be ($\pi$C)/4 in order for R in Equation 2 to be equal to $1/(2\pi$ fc C). As a result, the desired accurate corner frequency of the low-pass filter 402 will be established.

Variable resistors 416 and 420 can be implemented in a variety of ways. Each can comprise a bank of selectable resistors, for example. Other equivalent resistor networks will become apparent to a person skilled in the relevant art.

Control signal 406 can be a digital signal so as to select one or more of the individual resistors in each respective resistor bank. In order to produce a digital control signal 406, comparator 430 can comprise a comparator 412 coupled to A/D converter 414. Other equivalent circuits to implement the functionality of comparator 430 for generating control signal 406 will become apparent to a person skilled in the relevant art.

In the case in which operational amplifier 412 is employed, the inventors have also discovered that the DC offset voltage of the operational amplifier produces undesirable characteristics at low VADJ voltage. To compensate for this, fCLK can be adjusted until the desired value for the LPF 402 corner frequency $f_c$ is achieved.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention. This is especially true in light of technology and terms within the relevant art(s) that may be later developed.

The present invention has been described above with the aid of functional building blocks or modules (see 416, 420 and 430, for example) illustrating the performance of specified functions and relationships thereof. The boundaries of these functional building blocks have been defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A method, comprising:
   (a) forming a filter through coupling a first resistor having a first resistance value and a capacitor having a first capacitance value;
   (b) setting a corner frequency of the filter using the first resistance value and the first capacitance value; and
   (c) forming a tuning device through coupling a second resistor having a second resistance value, a switched-capacitor having a third resistance value, and a comparator having an amplifier and an analog-to-digital converter; and
   (d) comparing voltage signals using the comparator to produce a control signal that adjusts the first and second resistance values as a function of the third resistance value.

2. The method of claim 1, further comprising:
   receiving a first one of the voltage signals from the switched-capacitor;
   receiving a second one of the voltage signals from a reference source; and
   adjusting the corner frequency of the filter through varying at least one of the first and second voltage signals.

3. The method of claim 1, further comprising:
   using a clock to control the switched-capacitor, such that varying frequency of the clock adjusts the corner frequency.

4. The method of claim 1, further comprising:
   receiving a first one of the voltage signals from the switched-capacitor;
   receiving a second one of the voltage signals from a reference source; using a frequency of a clock to control the switched-capacitor; and
   changing at least one of the first and second voltage signals or changing the frequency of the clock to adjust the corner frequency of the filter.

5. The method of claim 1, wherein step (a) further comprises coupling a second amplifier to the resistor and the capacitor to form the filter.

6. The method of claim 5, wherein step (a) further comprises configuring the second amplifier as an inverting integrator.

7. The method of claim 5, wherein step (a) further comprises using an operational amplifier as the second amplifier.

8. The method of claim 1, wherein step (d) further comprises using the control signal to substantially simultaneously adjust the first and second resistance values.

9. The method of claim 8, wherein step (d) further comprises adjusting the first and second resistance values, such that the first and second resistance values are substantially equal.

10. The method of claim 1, wherein step (c) further comprises using an operational amplifier as the amplifier.

11. The method of claim 1, further comprising:
    coupling together a first plurality of selectable resistors to form the first resistor;
    coupling together a second plurality of selectable resistors to form the second resistor;
    using a digital value as the control signal; and
    adjusting the first and second resistance values by selecting at least one particular resistor in each of the first and second plurality of selectable resistors.

12. The method of claim 1, wherein step (c) further comprises:
    providing a second amplifier in the tuning device;
    coupling a non-inverting input of the second amplifier to ground;
    coupling an output of the second amplifier to the comparator;
    coupling the switched-capacitor between a first one of the voltage signals and the inverting input of the second amplifier; and
    coupling the second resistor between the inverting input and the output of the second amplifier.

13. The method of claim 12, wherein step (c) further comprises using an operational amplifier as the second amplifier.

* * * * *